(12) United States Patent
Lazar et al.

(10) Patent No.: US 8,405,027 B2
(45) Date of Patent: Mar. 26, 2013

(54) CONTRAST FOR SCANNING CONFOCAL ELECTRON MICROSCOPE

(75) Inventors: Sorin Lazar, Eindhoven (NL); Bert Henning Freitag, Eindhoven (NL); Peter Christiaan Tiemeijer, Eindhoven (NL)

(73) Assignee: Fei Company, Hillsboro, OR (US)

(*) Notice: Subject to any disclaimer, the term of this patent is extended or adjusted under 35 U.S.C. 154(b) by 74 days.

(21) Appl. No.: 13/182,992

(22) Filed: Jul. 14, 2011

(65) Prior Publication Data

US 2012/0012747 A1 Jan. 19, 2012

Related U.S. Application Data

(60) Provisional application No. 61/364,355, filed on Jul. 14, 2010.

(51) Int. Cl.
G01N 23/04 (2006.01)
(52) U.S. Cl. ......... 250/311; 250/306; 250/307; 250/310
(58) Field of Classification Search ............... 250/306, 250/307, 310, 311
See application file for complete search history.

(56) References Cited

U.S. PATENT DOCUMENTS

| | | | |
|---|---|---|---|
| 3,013,467 A | 12/1961 | Minsky | |
| 3,908,124 A * | 9/1975 | Rose | 250/311 |
| 5,751,417 A | 5/1998 | Uhl | |
| 6,218,663 B1 | 4/2001 | Nisch et al. | |
| 6,548,810 B2 | 4/2003 | Zaluzec | |
| 6,570,156 B1 | 5/2003 | Tsuneta et al. | |
| 7,372,029 B2 * | 5/2008 | Tsuneta et al. | 250/311 |
| 7,580,171 B2 | 8/2009 | Uhl et al. | |
| 7,706,043 B2 | 4/2010 | Uhl et al. | |
| 7,777,185 B2 * | 8/2010 | de Jonge | 250/311 |
| 2003/0025075 A1 * | 2/2003 | Zaluzec | 250/306 |
| 2006/0012871 A1 * | 1/2006 | Funk et al. | 359/385 |
| 2007/0158568 A1 | 7/2007 | Nakamura et al. | |
| 2007/0228277 A1 * | 10/2007 | Tsuneta et al. | 250/311 |
| 2009/0078868 A1 * | 3/2009 | de Jonge | 250/310 |

FOREIGN PATENT DOCUMENTS

| | | |
|---|---|---|
| JP | 2000-331637 | 11/2000 |
| JP | 2001-006591 | 1/2001 |

OTHER PUBLICATIONS

Cosgriff, E.C., et al., "Three-dimensional imaging in double aberration-corrected scanning confocal electron microscopy, Part I: Elastic scattering," Ultramicroscopy, 2008, pp. 1558-1566, vol. 108.

Cosgriff, E.C., et al., Three-dimensional imaging in double aberration- corrected scanning confocal electron microscopy, Part II: Inelastic scattering, Ultramicroscopy, 2008, pp. 1567-1578, vol. 108.

Takeguchi, Masaki, et al., "Development of a stage-scanning system for high-resolution confocal STEM," Journal of Electron Microscopy, Jul. 4, 2008, pp. 123-127, vol. 57, No. 4.

Chu, M.-W. et al., "Emergent Chemical Mapping at Atomic-Column Resolution by Energy-Dispersive X-Ray Spectroscopy in an Aberration-Corrected Electron Microscope," Physical Review Letters, May 14, 2010, vol. 104, 4 pages.

* cited by examiner

*Primary Examiner* — Michael Logie
(74) *Attorney, Agent, or Firm* — Scheinberg & Associates, PC; Michael O. Scheinberg

(57) ABSTRACT

A scanning confocal transmission electron microscope includes a descan deflector and a corrector below the sample. The microscope uses a detector that is preferably significantly larger than the resolution of the microscope and is positioned in the real image plane, which provides improved contrast, particularly for light elements.

15 Claims, 7 Drawing Sheets

PRIOR ART  FIG. 1

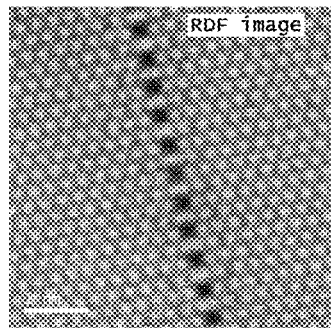 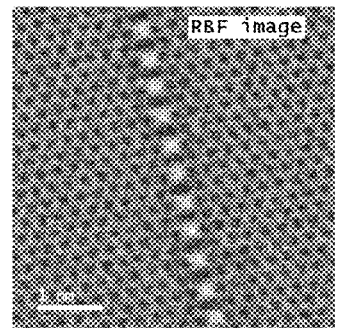
FIG. 6A                FIG. 6B
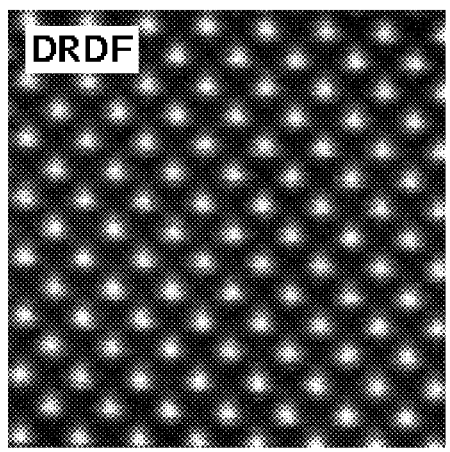 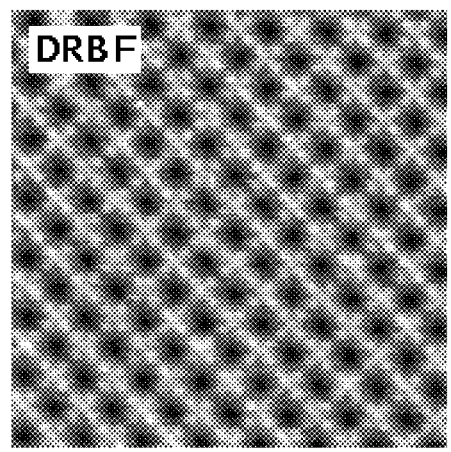
FIG. 7A                FIG. 7B

CONTRAST FOR SCANNING CONFOCAL ELECTRON MICROSCOPE

The present application claims priority from U.S. Prov. Pat. App. No. 61/364,355, filed Jul. 14, 2010, which is hereby incorporated by reference.

TECHNICAL FIELD OF THE INVENTION

The present invention relates generally to transmission electron microscopy and in particular to improving contrast in a scanning confocal electron microscope.

BACKGROUND OF THE INVENTION

In confocal microscopy, an illumination source is focused onto a point at the sample, and then an image of the sample point is formed at an aperture.

The focal point of the illumination source is scanned across the sample, and the light intensity at the aperture is used to form an image, with the intensity of each image point corresponding to the intensity of light passing through the aperture. By focusing the illumination source at different depths within a sample, images from different depths in the interior of a transparent sample can be formed because the small aperture blocks electrons scattered from depths other than the focal depth.

Confocal microscopy was developed using light microscopy, but it has recently been applied to electron microscopy. In conventional confocal electron microscopy, a disc detector is placed at the aperture in a plane conjugate to the specimen. The size of the disc detector as projected back to the specimen plane is about equal to the lateral resolution of the confocal image, which is typically a few Angstrom. Because the beam must scan across the sample, it is necessary to align the detector below the sample with the beam above the sample. U.S. Pat. No. 6,548,810 to Zaluzec for "Scanning Confocal Electron Microscope" describes the use of "descan" coils to bring the beam that has passed through the sample back onto the optical axis to pass through an aperture and into a detector.

Because of the very small disc detector used in confocal microscopy, the de-scanning and the re-focusing of the beam is not sufficiently precise to provide for atomic resolution. To overcome this problem, recent publications in the field of scanning confocal microscopy describe a mechanism in which the sample moves under the beam, instead of the beam moving over the sample. For example, Takeguchi et al., "Development of a stage scanning system for high resolution confocal STEM," Journal of Electron Microscopy 57(4) 123-127 (2008) describes a confocal electron microscope in which the sample is mounted in a goniometer that uses piezoelectric actuators to move the sample. By scanning the sample in a rectangular raster pattern, the microscope can form a two dimensional image of a plane of the sample. By moving the sample up or down, information from multiple planes inside the sample can be acquired to form a three-dimensional image. Mechanical scanning, however, is much slower than scanning the electron beam.

Similarly, Cosgriff, D'Alfonso, et al., "Three-dimensional imaging in double aberration-corrected scanning confocal electron microscopy, Part I: Elastic Scattering," Ultramicroscopy 108 (pp. 1558-1566 2008) shows a sample that can be moved in an X-Y plane as well as in the Z direction, to form a three dimensional image of the sample.

D'Alfonso, Cosgriff, et al, "Three-dimensional imaging in double aberration-corrected scanning confocal electron microscopy, Part II: inelastic Scattering," Ultramicroscopy 108 (pp. 1567-1578 2008) uses a scanning confocal electron microscope to determine the location of isolated impurity atoms embedded within a bulk matrix. D'Alfonso identifies an individual impurity atom using the electron energy loss from inner shell ionization and detects the energy loss electron by directing a defocused electron toward a detector.

SUMMARY OF THE INVENTION

An object of the invention is to provide an improved contrast in scanning confocal electron microscopy.

In one preferred embodiment, the invention scans an electron beam across a sample and descans the beam under the sample. The beam under the sample is corrected for spherical aberration. Applicants have found that a corrector positioned below the sample can improve image contrast. Improved contrast provides, for example, the ability to image light atoms, which ability was not present in the prior art. Unlike a conventional SCEM (scanning confocal electron microscope) in which a small aperture and detector eliminates electrons that are not focused at the aperture plane, embodiments of the present invention use a detector that is significantly larger than the resolution of the electron source image at the detector plane to collect electrons that are displaced when passing through the specimen and discarding the electrons that are not focused at the detector plane.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIGS. 6A and 6B shows dark field and bright field images, respectively of a Au <111> specimen obtained using embodiments of the invention;

FIGS. 7A and 7B show a defocused dark field and a defocused bright field image, respectively, obtained using embodiments of the invention that show boron atomic columns in a Lanthanum crystal.

DETAILED DESCRIPTION OF PREFERRED EMBODIMENTS

Figure 1:
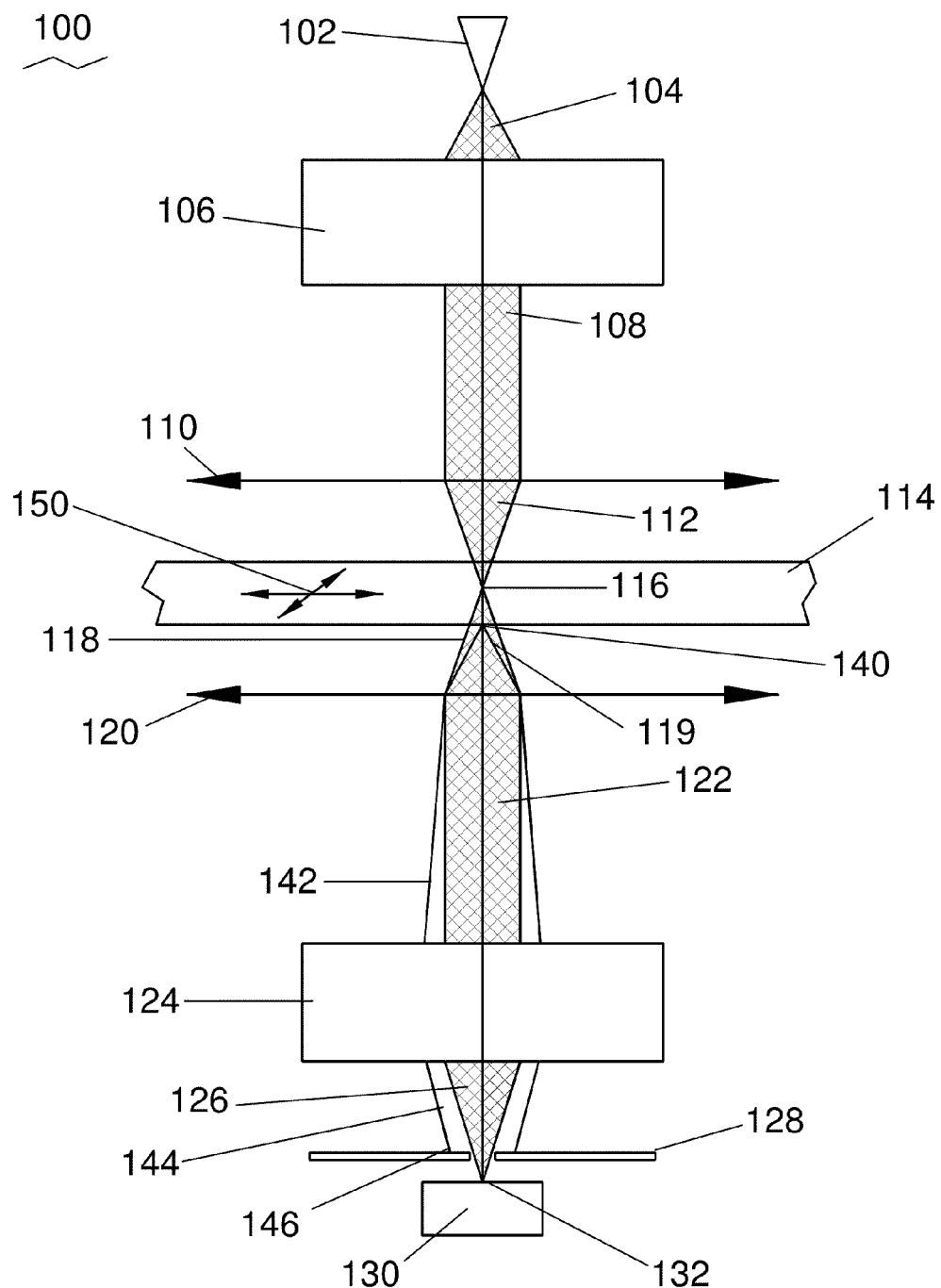
FIG. 1 shows a prior art electron beam system.

Although those of ordinary skill in the art will readily recognize many alternative embodiments, especially in light of the illustrations provided herein, this detailed description is exemplary of the preferred embodiments of the present invention, the scope of which is limited only by the appended claims.

Applicants have found that the use of a corrector below the sample enhances contrast. Embodiments of the invention will enable a new application that can provide 3D information about the specimen. Moreover, due to the capability of the Real Bright Field (RBF) detector to remove inelastic scattered electrons, the technique can be used to image thick specimens.

Traditionally, STEM detection was performed in or near the back focal plane, also known as the diffraction plane, of the lens below the sample. The detector in confocal microscopy was positioned in the real image plane of the lens below the sample, and was used primary for three-dimensional imaging because of its ability to provide information from a pre-determined depth within a sample. Applicants have found that using a corrector below the sample to correct the image of the sample allows STEM-type detection to be performed in the real image plane and provides improved contrast compared to detection in the diffraction plane performed.

When conventional STEM detection is performed in the diffraction plane, the electron pattern in the diffraction plane is stationary as the beam is scanned (assuming telecentric scanning). Because the electron pattern in the real image plane is not stationary when the beam is scanned, it is necessary to de-scan the beam so that the intensity distribution can be projected onto a fixed detector.

As the beam scans by columns of atoms in a sample, the beam is displaced, which provides a redistribution of the electrons in real space, which shows as contrast in an image that can be detected using a ring and/or disk detector.

Embodiments of the invention will allow new applications that provide complementary information to the conventional STEM, and that provide a new modality to visualize light elements.

Embodiments of the invention will permit using the new Defocused Real STEM technique and will provide direct chemical contrast.

Embodiments of the present invention:

(1) dramatically improve the speed with which confocal images can be recorded by replacing the stage movement by combined beam movements;

(2) open the possibility of basic chemical mapping in STEM without the need of an expensive imaging energy filter;

(3) offer a new contrast mechanism based on the redistribution of the probe due to specimen interactions;

The invention enables new contrast mechanisms that provide improved results for:

(4) visualizing light elements (such as H, O, N, B, Li);

(5) separating the elastic signal from the inelastic signal.

(6) visualization of electric and magnetic fields in the specimen unit by unit cell. The electric and magnetic field of the specimen is deflecting the small probe (Lorentz force, electric force). With a segmented disk detector these shifts can be detected to determine the strength and the direction of the deflection with the resolution of the probe.

So far this is only done in the diffraction plane (differential phase contrast method (DPC) Prof. John Chapman et. al., Glasgow, UK). The preferred embodiment is in real space, which provides an advantage.

The present invention is based on the recognition that, in a confocal set-up or in a scanning set-up, a Cs-corrected image of an atomically sharp probe contains a wealth of information about the specimen. This information is, for example, the spatial redistribution of the probe by specimen interactions, or the local change of beam direction caused by elastic and inelastic scattering. The prior art simple disc detector with an aperture size corresponding to the image of the focused probe cannot record all this information.

In order to access (parts of) this information, one or more of the following changes to the simple disc detector can be made in various embodiments:

the detector does not need to be a disc detector but can be a ring detector, optionally surrounding a center disk detector;

the detector does not need to have a size comparable the resolution but can be significantly larger (e.g. 10×);

the detector does not need to be positioned in an exact focus image of the probe but can be placed somewhat out-of-focus.

the detectors can be as well segmented.

Embodiments of the invention include the combination of an electron microscope capable of scanning a beam across a specimen; a de-scanning device for re-directing the scanned beam to the optical axis; a corrector which corrects at least the spherical aberration of the image system; a disc detector and/or a ring detector for recording the beam intensity at or close to the image of the probe. The de-scan unit and the corrector create a sharp and stationary image of the probe at or close to the plane of the detector.

Contrast is generated because the redistribution of the beam in the specimen depends on the position of the probe with respect to the atomic columns. A calculation of the redistribution in InGaAs for a probe incident on an InGa column is described in Chu et al., Phys. Rev. Lett. 104 (2010) 196101].

In accordance with some embodiments of the invention:

Depth-sectioning of the specimen can be done by synchronously changing the focus of the probe forming optics and the focus of the imaging optics (contrary to depth-sectioning by mechanically changing the height of the specimen);

The apparent size of the detector at the plane of the specimen can be tuned by tuning the magnification from specimen to detector; and The detector can be an EELS spectrometer, in order to form an image of only those electrons which have obtained a certain spatial redistribution in combination with a certain energy loss. This can be used to discern between the signal of elastic EELS and inelastic EELS.

In conventional STEM imaging, the detector is placed conjugate to the back-focal plane of the objective lens, and the disc and ring detector are called the bright field (BF) and dark field (DF) detector. The imaging method in embodiment of the invention is similar except that the detectors are placed conjugate to the real image of the specimen. Therefore, we will call this technique Real space STEM (R-STEM) and the detectors Real DF (RDF) and Real BF (RBF) detector.

Embodiments of the invention can have the following attribute:

Confocal set-up with disc detector significantly larger than the lateral resolution Confocal set-up with ring detector Confocal set-up with defocused image at detector, in order to enhance contrast of the light elements Confocal set-up with de-scan unit and Cs-correction to get atomically sharp and stationary image of the probe, in order to record differences in spatial broadening due to specimen interactions.

FIG. 1 is a schematic side view of a prior art electron beam system 100. A diverging beam 104 is emitted from a source tip 102, such as a cold field emitter or a Schottky emitter. An aberration corrector 106 focuses electrons 104 into an approximately parallel beam 108 which is directed parallel to the column optical axis to enter a first lens 110. Corrector 106 may be configured to correct spherical aberration or a combination of spherical aberration and on-axis chromatic aberration. Lens 110 forms a beam focus 116 within the bulk of specimen 114, wherein beam 112 is converging for all portions of specimen 114 above focus 116, and becomes a diverging beam 118 for all portions of specimen 114 below focus 116. In the prior art electron beam system illustrated in FIG. 1, the specimen is mechanically scanned in an X-Y raster pattern 150 to acquire two-dimensional imaging data from the specimen 114. Lens 120 focuses the diverging electron beam 118 into an approximately parallel beam 122, which is directed into lower aberration corrector 124. Lower corrector 124 focuses electron beam 122 into a converging beam 126, which passes through a small opening in aperture plate 128, and hence to an electron detector 130.

The beam crossover 116 is in the desired image plane, within the bulk of specimen 114. However, since the electron beam largely penetrates through the entire bulk of the specimen 114 (subject to some degree of electron absorption), it is possible for electrons to scatter from any level within the specimen 114, not necessarily at the image plane containing crossover 116. For example, electrons 119 are shown scattering at the lower surface of the specimen 114. Because electrons 119 will intersect lens 120 from a point below the image plane, lens 120 will focus these electrons into a diverging beam 142. The lower corrector 124 is configured to correct spherical or spherical and chromatic aberrations for the unscattered beam 122. Since electrons 142 reach corrector 124 with larger angles than the trajectories within beam 122, corrector 124 will not achieve full aberration correction, thus electrons 144 emerging from corrector 124 and corresponding to rays 142, will reach the plane of aperture plate 128 at a radius outside of the opening in aperture plate 128, thus striking the aperture plate 128 a point 146, as shown. Thus, electrons which are scattered from locations within specimen 114 which are not within the desired image plane will not pass to the detector 130. This aperturing function thus improves the depth resolution achievable in the prior art electron beam system 100.

Then the ring detector can be used to form an image with only those electrons which have obtained a certain lateral re-distribution in the specimen; a defocused image of the probe on the disc detector can use the chromatic aberration of the imaging system to enhance the signal of those electrons which have obtained a certain energy loss in the specimen. Electrons scattered to very high angles will not be refocused to a small disc detector due to the higher order aberrations of the imaging system. The disc detector can be given a size such that only electrons scattered up to a certain angle are detected. Specifically, a proper combination of detector size and defocus of the image of the probe can be used to enhance the signal of light elements (such as H, O, N, B, and Li) which mostly forwardly scatter. The defocus of the image of the probe on the detector can be achieved by changing the transfer lens in the image corrector or the lenses in the projector system Furthermore, with such larger sized detectors, the optical scanning-descanning scheme becomes feasible again and can replace the much slower mechanical scanning.

Figure 2:
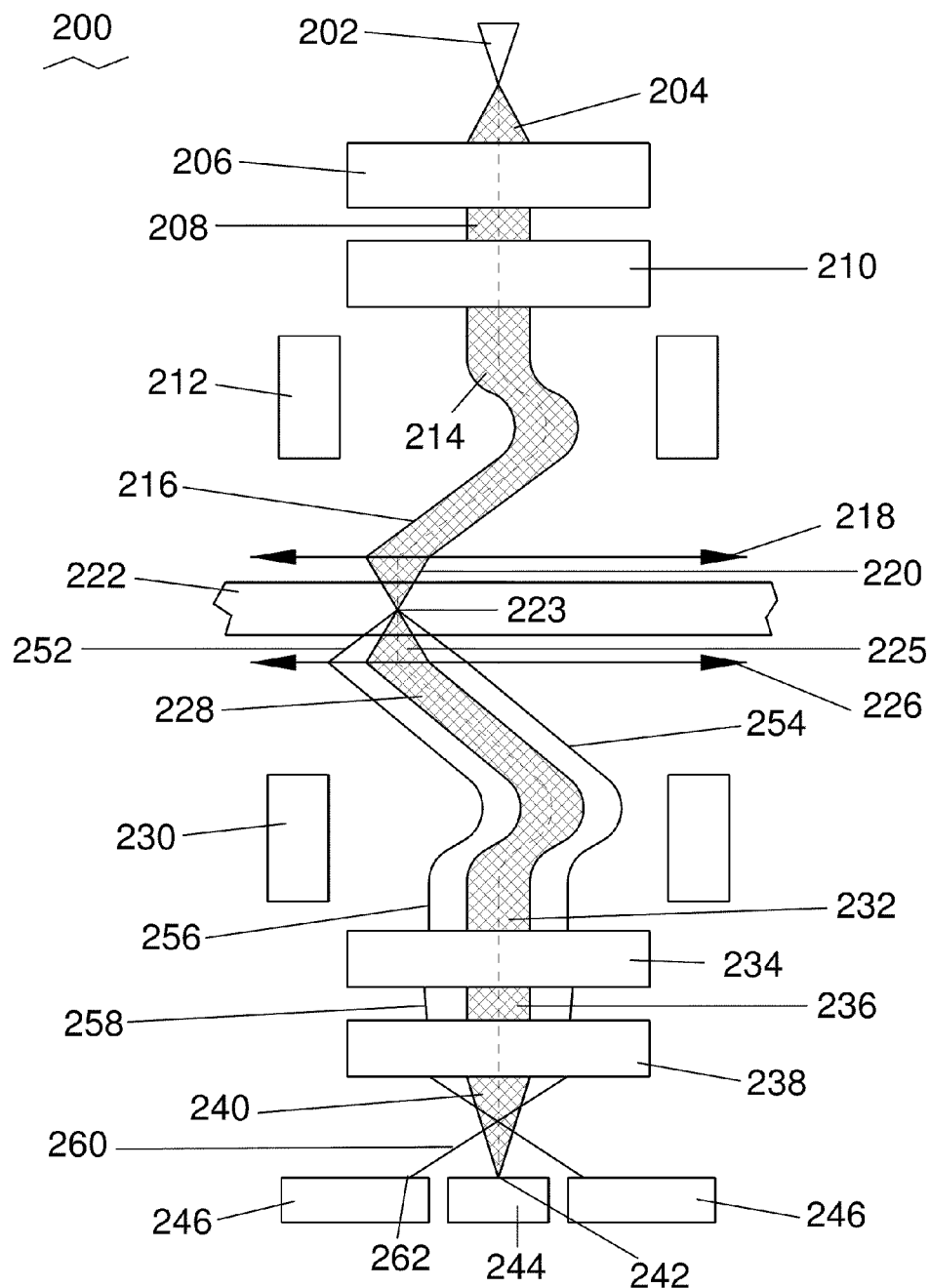
FIG. 2 is a schematic illustration of an electron beam system of the present invention operating in a mode where the unscattered and purely inelastically-scattered electrons (i.e., electrons with small scattering angles) are collected by a center (disk) detector, while the elastically-scattered electrons (i.e., electrons with larger scattering angles) are collected by an outer (annular) detector.

FIG. 2 is a schematic side view of an electron beam system 200 according to the invention. A diverging beam of electrons 204 is emitted from a source tip 202, such as a cold field emitter or Schottky emitter, familiar to those skilled in the art. A condenser column 206 focuses electrons 204 into an approximately parallel electron beam 208 which is directed parallel to the column optical axis to enter an optional upper aberration corrector 210. Corrector 210 may be configured to correct spherical aberration or a combination of spherical and on-axis chromatic aberration, as is familiar to those skilled in the art. Details of the operation of the condenser column 206 and the upper aberration corrector 210 are not part of the present invention. Electron beam 214 emerges from corrector 210, and enters a double-deflector 212, which may comprise magnetic deflection coils, electrostatic deflection plates, or a combination of magnetic and electrostatic deflection elements, as is familiar to those skilled in the art—details of the double-deflector design are not part of the present invention. A key element of double-deflector 212 is that it comprises two stages of beam deflection—a first stage which deflects the beam to the right of FIG. 2, followed by a second stage which deflects electron beam 214 back towards the left. The purpose of double-deflection is to steer beam 214 through the focal plane of lens 218, such that the focused beam 220 emerging from lens 218 is telecentric to the specimen 222. Telecentric scanning refers to a scan mode in which the beam is always approximately perpendicular to the specimen surface over the extent of the scanning field of view. Lens 218 forms a beam focus 223 within the bulk of specimen 222, wherein beam 220 is converging for all portions of specimen 222 above focus 223, and becomes a diverging beam 225 for all portions of specimen 222 below focus 223.

Lens 226 focuses the diverging electron beam 225 into an approximately parallel beam 228, which is directed into a double-deflection descanning system 230. The purpose of descanning is well known in the art—for the optimal operation of the projector optics 238, detectors 244 and 246, as well as the lower corrector 234, it is highly desirable that the electron beam is centered on the symmetry axis, independent of the location of beam focus 223 within the specimen. Note that the double-deflection deflector 230 also has two stages of beam deflection, as was the case for deflector 212 above the specimen 222. The first (upper) stage deflects the beam to the left of FIG. 2, while the second (lower) stage deflects the beam back to be both on-axis and parallel to the axis, with no residual dynamic beam deflection due to the scanning induced by deflector 212. Thus, beam 232 exiting from the deflector 230 is ideally motionless and on-axis upon entrance to the lower aberration corrector 234. Corrector 234 may be configured to correct spherical aberration or a combination of spherical and on-axis chromatic aberration, as is familiar to those skilled in the art. Beam 236 emerges from the corrector 234 and enters the projector column 238, which forms a beam cross-over 242 at the plane of the center detector 244, typically a disk. Details of the operation of the lower aberration corrector 234 and the projector column 238 are not part of the present invention.

Now, we examine the focusing behavior of electrons 252 which are scattered elastically by specimen 222, emerging from the lower surface of specimen 222 with larger scattering angles with respect to the column optical axis. Lens 226 will focus electrons 252 into a roughly parallel beam with a larger radius (measured form the optical axis) than the unscattered beam 225. Due to spherical aberration in lens 226, electrons 252 will tend to be deflected more strongly than unscattered electrons 225. The design of corrector 234 and also projector column 238 are generally optimized for smaller beam radii and angles, typical of electron trajectories within beam 232 (entering corrector 234) and electron trajectories within beam 236 (entering projector column 238). Larger radii and/or angle electron trajectories such as 256 (entering corrector 234) and trajectories 258 (entering projector column 238) will exhibit aberrations resulting in trajectory 260 striking detector 246 at a location 262, off-axis from the location 242 where the unscattered beam 240 strikes detector 244. In FIG. 2, the intersection 262 of elastically-scattered electrons 260 with the detector plane is shown on the outer detector 246, which may be either a single ring detector or a segmented ring detector, as is familiar to those skilled in the art.

Note that if the focusing strength of the combination of the condenser column 206, the upper aberration corrector 210, and lens 218 is increased, then the beam crossover 223 will move upwards, towards the upper surface of the specimen 222. If the focusing strength of the combination of the lens 226, lower aberration corrector 234 and the projector column 238 is simultaneously decreased by the proper amount, then the trajectories 240 and 260 between the exit of the projector column 238 and the detector plane will be preserved—in this operating mode, depth sectioning is enabled throughout the entire thickness of the specimen 222 by simultaneous adjustments to the upper and lower parts of the focusing optics. Clearly, this method of depth sectioning is much faster and more reproducible than prior art methods employing mechanical stage motions of the specimen along the optical axis.

In this operating mode, the center detector 244 may be used as a "Real Bright Field" (RBF) detector and the outer detector 246 as a "Real Dark Field" (RDF) detector. This means that the RBF detector 244 will collect the unscattered electrons and some or all of the purely inelastically scattered (i.e., low scattering angle) electrons—this corresponds to a bright-field imaging mode. Simultaneously, the RDF detector 246 will collect a portion of the elastically-scattered electrons—this corresponds to a dark-field imaging mode.

Figure 3:
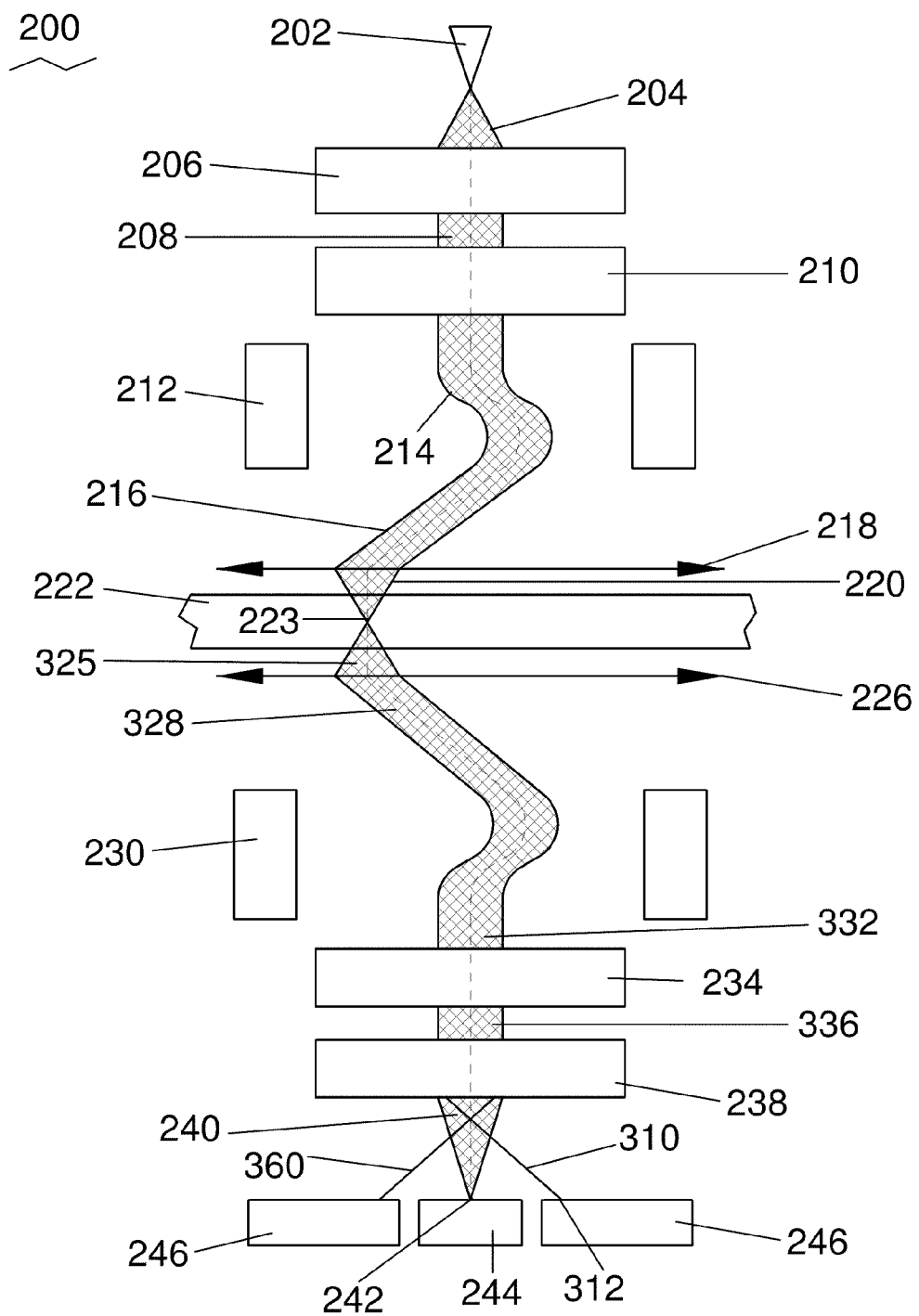
FIG. 3 is a schematic illustration of an electron beam system of the present invention operating in a mode in which unscattered electrons are collected by the center (disk) detector, while inelastically scattered (i.e., energy-loss) electrons over a certain energy range are collected on the outer (annular) detector.

FIG. 3 illustrates another embodiment of the invention wherein the combined electron optical focusing effects of the lower corrector 234 and the projector column 238 have been retuned so that electrons 310 undergoing some degree of energy loss with the specimen 222 emerge from the projector column 238 with trajectories 360, and will reach the detector plane at a location 312 on the outer detector 246. Note that since purely inelastically-scattered electrons have little angular deflection, the beams 325, 328, 332, and 336, represent combinations of both unscattered and inelastically-scattered electrons. Chromatic aberrations arising in lens 226 due to inelastic energy losses are ignored in FIG. 3. Essentially, the combined chromatic aberrations in the lower corrector 234 and the projector column 238 serve to deflect inelastically-scattered electrons 310 far enough off-axis so that intersection 312 falls on the outer (RDF) detector 246. The relative amounts of retuning of the lower corrector 234 and the projector column 238 can be adjusted so that only a portion of the inelastically-scattered electrons fall on the outer (RDF) detector 246—in this operating mode, the RDF detector functions as an inexpensive energy bandpass filter for the inelastically-scattered electrons.

Figure 4:
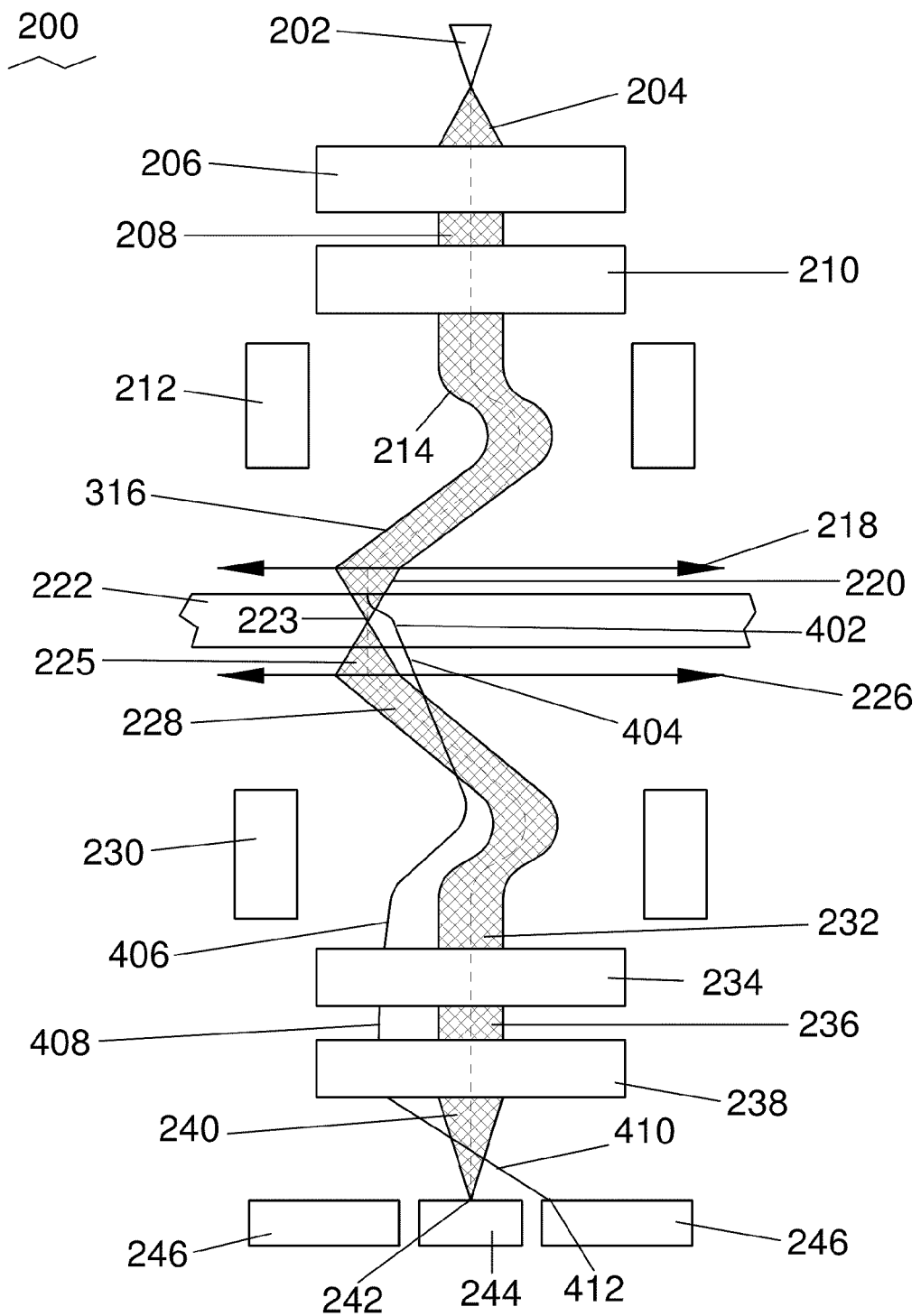
FIG. 4 is a schematic illustration of an electron beam system of the present invention operating with electrons displaced within the specimen bulk collected by the outer (annular) detector while undisplaced electrons are collected by the center detector.

FIG. 4 illustrates yet another embodiment of the invention. A portion of the converging electron beam 220 incident on the specimen 222 is deflected within specimen 222 by scattering off atoms within specimen 222, thereby forming electron trajectory 402 within specimen 222. Trajectory 402 may arise from one or more elastic scattering events, possibly combined with electron channeling within a crystalline lattice. The net result is that trajectory 402 emerges through the lower surface of the specimen 222 with an angle and location which are outside the unscattered beam 225, as shown in FIG. 4. Because of this combined displacement and angular deflection, trajectory 404 is focused differently by lens 226 than the electrons within diverging beam 225. After passage and deflection by the double-deflection descanning deflector 230, trajectory 406 enters the lower aberration corrector 234 at a different radius and with a different angle than for the unscattered beam 232. Because of this, the corresponding trajectory 408 entering the projector column 238 is also at a different radius and with a different angle than unscattered beam 236. Correspondingly, trajectory 410 emerges from the projector column 238 with a different (larger in this example) angle, reaching the detector plane at a location 412 on the outer (RDF) detector 246. Thus, with this configuration of settings on the lower corrector 234 and the projector column 238, a signal may be formed with information about beam displacements within the specimen 222. In the imaging mode of FIG. 4, contrast is generated because the redistribution of the beam in the specimen depends on the position of the probe with respect to the atomic columns.

Figure 5:
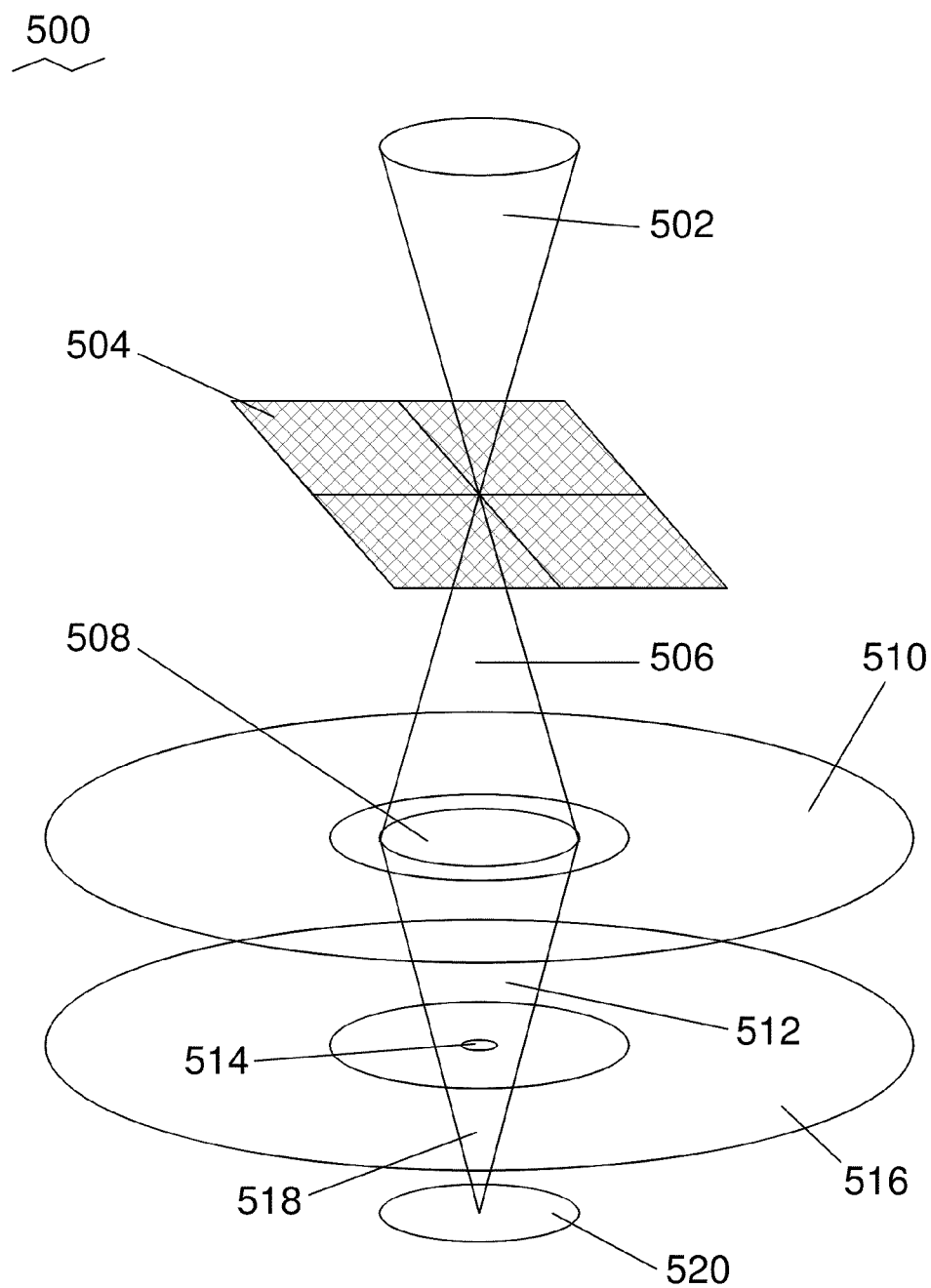
FIG. 5 illustrates a conventional (back focal plane) STEM detector configuration, and the detector configuration of the present invention.

FIG. 5 illustrates a converging conical electron probe 502 focused onto a thin (transmission) specimen 504. Electrons 506 which have passed through the specimen 504 emerge from the lower surface of specimen 504 in a diverging conical beam 506. A conventional STEM back focal plane detector is shown as a center detector 508, surrounded by an annular detector 510. As is well-known in the art, detectors 508 and 510 are located in the back focal plane of a projector lens (not shown in FIG. 5—see lens 120 in FIG. 1), such that all trajectories exiting from the specimen 504 with a particular angle with respect to the optical axis will be focused (to first-order) at the same position in the plane of detectors 508 and 510. Trajectories exiting from the specimen 504 at other angles will similarly be focused to other positions in the plane of detectors 508 and 510. The alternative detector configuration of the present invention is illustrated by center detector 514 and annular (ring) detector 516, which are located slightly above the conjugate focal plane to the specimen plane (in particular, preferably conjugate to the plane within specimen 504 at which the probe has the minimum diameter). Center detector 514 is configured to be smaller than the beam diameter at the plane of detectors 514 and 516, thus a substantial portion of beam 512 passes by detector 514 and is collected by detector 520 at the plane conjugate to the specimen plane. It should be understood from the figure that the operation of detectors 514 and 516 requires that the conventional prior art STEM detectors 508 and 510 are either not part of the column, or are moved off-axis from the optical axis of the column, since otherwise, beam 506 would be stopped at detector 508 and could not pass to detectors 514, 516, or 520.

The remaining discussion will concern detectors 514, 516 and 520, and will assume the absence of detectors 508 and 510. Detectors 514 and 520 are both shown collecting portions of beam 512 which has passed through the back focal plane of the lens (the plane where detectors 508 and 510 for normal STEM imaging would have been located).

Electrons scattered off-axis within the specimen 504 will strike ring detector 516. Since the central (unscattered) beam does not strike detector 516, any image formed using the signal from detector 516 will be a "dark-field" image. In addition, since detector 516 is approximately in the conjugate image plane to the specimen, the dark-field image formed using the signal from detector 516 is termed a "Dark Field Defocused Real STEM image, to distinguish this image from the conventional Dark-Field image using the signal acquired using the signal from an annular detector at the back focal plane (i.e., detector 510 in FIG. 5).

Electrons collected by the disk detector 514 correspond to those having small scattering angles, including unscattered electrons from the primary beam, as well as electrons scattered from low atomic number constituents of specimen 504—the image arising from this signal is termed a "Bright Field Defocused Real STEM image". Beam 512 is shown defocused so that those electrons in beam 512 with larger scattering angles (typically arising from electron scattering off higher atomic number elements) are able to pass around detector 514 and are then collected by detector 520. By this method, the signal from low atomic number atoms in specimen 504 is enhanced relative to the (typically much stronger) signal arising from higher atomic number elements within specimen 514. By this method, the relatively weak signal arising from low atomic number elements in the specimen 504 may be separated from the stronger signal arising from the higher atomic number elements within specimen 504 in a way that was previously impossible.

FIGS. 6A and 6B shows an R-STEM image showing clearly atomic resolution (acquired on a double Cs-corrected Titan TEM from a Au <111> specimen).

FIGS. 7A and 7B show that by choosing the central part of the defocused beam the forward scattered electrons are dominating and the contrast from the light elements columns is enhanced as can be seen in the images below. The images are obtained by Defocused R-STEM (DR-STEM). The left one is a Defocused Real Bright Field (DRBF) image that shows the position of the B atomic columns (bright spots in the image and purple in the projected structure) and the La atomic columns as black spots in the image and red dots in the projected structure. To applicants' knowledge, the prior art provides no easy technique available that allows direct visualization of such light elements in a TEM. The right one is a Defocused Real Dark Field (DRDF) image that shows the La atomic columns as bright spots in the image (red dots in the projected structure) and is obtained using a ring detector around the defocused spot in real space.

Figure 8:
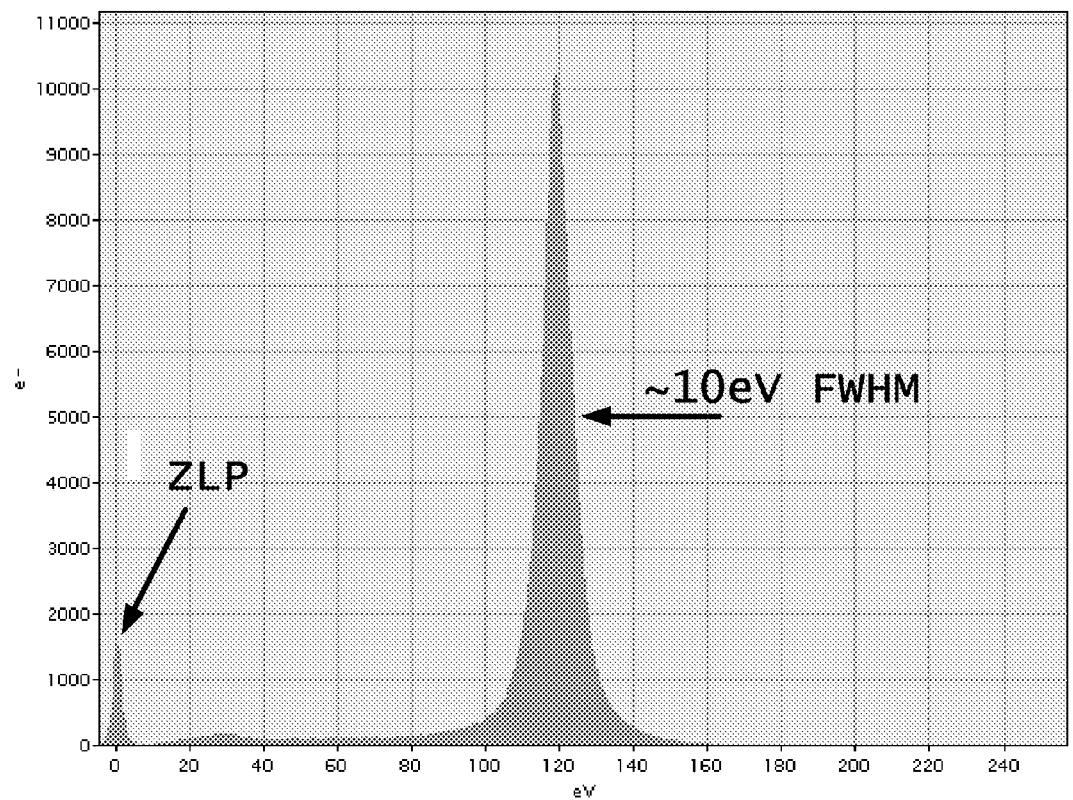
FIG. 8 shows an EELS spectrum for $LaB_6$ obtained in accordance with an embodiment of the invention.

FIG. 8 shows that an energy filtering effect can be achieved by putting an aperture around the beam. The position and width of the energy window can be adjusted by adjusting the defocus of the beam and the aperture size, respectively. The figure below shows an EELS spectrum recorded for a LaB6 specimen. The present combination of defocus and the detector size maximize the signal of electrons at 120 eV energy loss with a window of 10 eV.

For all the claims above no probe Cs corrector is mandatory. The only difference between a non probe corrected and probe Cs corrected microscope will be the difference in lateral resolution that can be obtained.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A scanning confocal electron microscope (SCEM), comprising:
   an electron source for generating an electron beam;
   a first deflector for scanning the electron beam across a portion of a sample;
   a first electron lens for focusing the electron beam to form an image of the electron source at the sample;
   a detector for detecting electrons that have passed through the sample;
   a second electron lens for focusing the electrons from the sample to form an image at or near the detector
   a second deflector for de-scanning the electron beam and directing the beam to the detector; and
   an image corrector for correcting the descanned image.

2. The SCEM of claim 1 in which the detector is segmented.

3. The SCEM of claim 1 in which the detector has an area that is at least twice the area of the image of the source as projected onto the detector plane and wherein the detector plane is conjugate or nearly conjugate to the source plane.

4. The SCEM of claim 3 in which the detector comprises a disk detector.

5. The SCEM of claim 3 in which the detector comprises a ring detector.

6. The SCEM of claim 3 in which the detector comprises a ring detector and a disk detector.

7. The SCEM of claim 3 in which the detector comprises an EELS spectrometer.

8. The SCEM of claim 1 in which the detector comprises a disk detector having a diameter at least twice the lateral resolution of the microscope.

9. A method of increasing contrast in a scanning confocal transmission electron microscope, comprising:
   generating an electron beam from an electron source; scanning the electron beam across a sample; focusing the electron beam into an image of the electron source at the sample;
   focusing the electron beam from the sample to form an image of the electron source at the detector;
   de-scanning the electron beam;
   correcting the spherical aberration in the descanned image of the electron source below the sample;
   and
   detecting the image of the electron source below.

10. The method of claim 9 in which detecting the image includes detecting a spatial redistribution of the probe by elastic or inelastic scattering.

11. The method of claim 10 in which detecting the image of the electron source below the sample includes detecting the electrons using an EELS spectrometer.

12. The method of claim 9 in which detecting the image includes using a ring detector that detects only electrons that have obtained a pre-determined lateral re-distribution passing through the specimen.

13. The method of claim 9 further comprising defocusing the image on the detector to enhance the signal of light elements.

14. The method of claim 9 in which detecting the image of the electron source below the sample includes detecting electrons that were not displaced within the sample using a disc detector and detecting electrons that were displaced within the sample using a ring detector.

15. The method of claim 14 further comprising adjusting the magnification of a projector column to so that electrons scattered at high angles in the sample do not impact the detector.

* * * * *

UNITED STATES PATENT AND TRADEMARK OFFICE
CERTIFICATE OF CORRECTION

PATENT NO. : 8,405,027 B2  
APPLICATION NO. : 13/182992  
DATED : March 26, 2013  
INVENTOR(S) : Lazar et al.

Page 1 of 1

It is certified that error appears in the above-identified patent and that said Letters Patent is hereby corrected as shown below:

Title Page 1, item (73), under "Assignee" heading please correct 'Fei Company, Hillsboro, OR (US)' to read, --FEI Company, Hillsboro, OR (US)--

Signed and Sealed this  
Twenty-fourth Day of September, 2013

Teresa Stanek Rea  
*Deputy Director of the United States Patent and Trademark Office*